(12) United States Patent
Wu et al.

(10) Patent No.: US 12,557,450 B2
(45) Date of Patent: Feb. 17, 2026

(54) PACKAGING STRUCTURE AND DISPLAY DEVICE

(71) Applicant: BRIGHTEK OPTOELECTRONICS CO., LTD. (Jiangsu), Nantong (CN)

(72) Inventors: Feng Wu, Nantong (CN); Chih-Hung Tzeng, Nantong (CN); Chien-Chung Huang, Nantong (CN)

(73) Assignee: BRIGHTEK OPTOELECTRONICS CO., LTD. (Jiangsu), Nantong (CN)

(*) Notice: Subject to any disclaimer, the term of this patent is extended or adjusted under 35 U.S.C. 154(b) by 625 days.

(21) Appl. No.: 17/969,186

(22) Filed: Oct. 19, 2022

(65) Prior Publication Data

US 2023/0343911 A1 Oct. 26, 2023

(30) Foreign Application Priority Data

Apr. 24, 2022 (CN) .......................... 202210455035.9

(51) Int. Cl.
*H01L 27/15* (2006.01)
*H01L 29/26* (2006.01)
(Continued)

(52) U.S. Cl.
CPC ........ *H10H 20/857* (2025.01); *H10H 29/142* (2025.01)

(58) Field of Classification Search
CPC H01L 25/00–50; H01L 2225/00–1094; H10K 19/901; H10K 39/601; H10K 59/90–95
See application file for complete search history.

(56) References Cited

U.S. PATENT DOCUMENTS

| 5,500,628 | A | * | 3/1996 | Knecht | H03B 5/32 361/728 |
| 7,560,811 | B2 | | 7/2009 | Sakakibara | |

(Continued)

FOREIGN PATENT DOCUMENTS

| CN | 2904306 Y | 5/2007 |
| CN | 105575941 A | 5/2016 |

(Continued)

OTHER PUBLICATIONS

First Chinese Office Action for Chinese Patent Application No. 202210455035.9 mailed Apr. 12, 2025. 14 pages.

*Primary Examiner* — Ismail A Muse
(74) *Attorney, Agent, or Firm* — Brooks Kushman P.C.

(57) ABSTRACT

A packaging structure, which includes a metal bracket, a driver chip, a light-emitting component, a packaging member and a metal cover plate. The metal bracket includes a plurality of pins, and first and second surfaces oppositely disposed. The driver chip is disposed on the first surface, and configured to control a light-emitting state of the light-emitting component. The light-emitting component is disposed on the second surface and electrically connected to the driver chip through the metal bracket. The packaging structure is disposed on the metal bracket, and configured to fix the metal bracket and enclose the driver chip and the light-emitting component. The pins are disposed surrounding the driver chip and are partially exposed from the packaging member. The metal cover plate is disposed on a side of the driver chip away from the light-emitting component, covering an entire surface of the driver chip.

15 Claims, 6 Drawing Sheets

(51) Int. Cl.
*H01L 31/12* (2006.01)
*H01L 33/00* (2010.01)
*H10H 20/857* (2025.01)
*H10H 29/14* (2025.01)

(56) References Cited

U.S. PATENT DOCUMENTS

| | | | |
|---|---|---|---|
| 8,338,933 | B2 | 12/2012 | Chen et al. |
| 9,859,193 | B2 | 1/2018 | Liu et al. |
| 2004/0188699 | A1 | 9/2004 | Kameyama et al. |
| 2009/0267104 | A1 | 10/2009 | Hsu et al. |
| 2015/0340352 | A1* | 11/2015 | Chung ............... F21V 31/04 438/27 |
| 2016/0134974 | A1* | 5/2016 | Salmon ............ B81C 1/00301 381/174 |
| 2019/0259924 | A1 | 8/2019 | Ho et al. |
| 2020/0066698 | A1* | 2/2020 | Huang ............... H10H 20/857 |
| 2020/0194359 | A1 | 6/2020 | Joshi et al. |
| 2020/0251458 | A1 | 8/2020 | Tsai et al. |
| 2021/0225280 | A1* | 7/2021 | Li ..................... G09G 3/3233 |

FOREIGN PATENT DOCUMENTS

| | | |
|---|---|---|
| CN | 109427704 A | 3/2019 |
| CN | 110828442 A | 2/2020 |
| CN | 110858584 A | 3/2020 |
| EP | 1858086 B1 | 11/2016 |
| EP | 3614428 A2 | 2/2020 |
| JP | H07288332 A | 10/1995 |
| JP | H10144965 A | 5/1998 |
| JP | H1174555 A | 3/1999 |
| JP | 2001118868 A | 4/2001 |
| JP | 2006173393 A | 6/2006 |
| JP | 2019050363 A | 3/2019 |
| JP | 2020031212 A | 2/2020 |
| KR | 20110006686 U | 7/2011 |

* cited by examiner

PACKAGING STRUCTURE AND DISPLAY DEVICE

CROSS-REFERENCE TO THE RELATED APPLICATION

Pursuant to 35 U.S.C. § 119 and the Paris Convention, this application claims priority to Chinese Patent Application No. 202210455035.9 filed Apr. 24, 2022, the content of which is incorporated herein by reference.

FIELD

The present application relates to the field of semiconductor technology, and in particular, to a packaging structure and a display device.

BACKGROUND

Light-emitting diode (LED) is a solid-state semiconductor device that can convert electrical energy into visible light. In an LED device, a solid semiconductor chip serves as a luminescent material to emit energy through a recombination of carriers, causing photon emission and directly converting electrical energy into light energy.

LED light sources are widely used in the field of display technology due to their advantages of high brightness, small size, low energy consumption and high stability. In this field, the key to improve the resolution of the LED display is to reduce the size of the LED packaging unit.

In the related technology, it is designed a vertical packaging structure to reduce the size of the LED packaging unit, that is, the LED chip and the driver chip are disposed on opposite sides. However, the driver chip is susceptible to external signal interference, in such a structure, and the driver chip is also prone to signal interference to other components of the circuit board during operation, which affects the normal usability of the LED packaging unit.

SUMMARY

An object of the present application is to provide a packaging structure and a display device, which can solve the problem of signal interference of a driver chip in the existing technologies.

In accordance with a first aspect of the present application, a packaging structure is provided, which includes a metal bracket, a driver chip, a light-emitting component, a packaging member, and a metal cover plate. The metal bracket includes a plurality of pins, and a first surface and a second surface disposed opposite to each other. The driver chip is disposed on the first surface of the metal bracket. The light-emitting component is disposed on the second surface of the metal bracket, and is electrically connected to the driver chip through the metal bracket. The driver chip is configured to control a light-emitting state of the light-emitting component. The packaging member is disposed on the metal bracket, configured to fix the metal bracket and enclose the driver chip and the light-emitting component. The pins are disposed surrounding the driver chip and are partially exposed from the packaging member, and the pins are configured to receive an external electrical signal and transmit the electrical signal to the driver chip. The metal cover plate is disposed on a side of the driver chip away from the light-emitting component, covering an entire surface of the driver chip.

In an embodiment, the metal bracket and the metal cover plate are of an integral structure, the metal cover plate is opposite to the first surface of the metal bracket, an accommodating gap is formed between the metal cover plate and the first surface of the metal bracket, and the driver chip is installed in the accommodating gap.

In an embodiment, the packaging includes a first colloid cured layer that is light-tight, the first colloid cured layer is configured to fix the metal bracket, fill the accommodating gap and enclose the driver chip, the first colloid cured layer is configured to form an accommodating groove on the second surface of the metal bracket, and the light-emitting component is installed in the accommodating groove.

In an embodiment, the packaging member includes a second colloid cured layer capable of transmitting light, and the second colloid cured layer is configured to fill the accommodating groove and enclose the light-emitting component.

In an embodiment, the pins are exposed from the first colloid cured layer and disposed surrounding outer sides of the first surface and the second surface, and the pins are extended to a bottom surface of the first colloid cured layer opposite to the first surface.

In an embodiment, the packaging member includes a first colloid cured layer that is light-tight, the first colloid cured layer is configured to fix the metal bracket, and form a first groove on the first surface of the metal bracket and a second groove on the second surface of the metal bracket. The driver chip is installed in the first groove, and the light-emitting component is installed in the second groove.

In an embodiment, the packaging member includes a second colloid cured layer capable of transmitting light and an insulation adhesive, the second colloid cured layer is filled in the second groove, enclosing the light-emitting component, the metal cover plate is fixed in the first groove through the insulation adhesive.

In an embodiment, the pins are extended from a position at the first surface to a bottom surface of the first colloid cured layer that is opposite to the first surface, and exposed from the bottom surface. The pins are disposed surrounding the first groove.

In an embodiment, the metal bracket includes a plurality of positioning blocks, and the positioning blocks are distributed around the first groove, and surrounding the metal cover plate.

The packaging structure provided by the present application includes a metal bracket, a driver chip, a light-emitting component, a packaging and a metal cover plate. The driver chip and the light-emitting component are respectively disposed on opposite sides of the metal bracket and are electrically connected through the metal bracket to form a vertical packaging structure. The packaging member is configured to fix the metal bracket, and enclose the driver chip and the light-emitting component. The pins are disposed surrounding the driver chip, and the metal cover plate is disposed on a side of the driver chip away from the light-emitting component, covering an entire surface of the driver chip. That is, the metal bracket, the pins and the metal cover plate are respectively disposed on different sides of the driver chip, so that the six sides of the driver chip are surrounded by metal, i.e., the driver chip is located in a space enclosed by metal, and thus the signal shielding capability of the packaging structure can be improved, the signal interference received by the driver chip can be reduced, the signal interference caused by the driver chip to external components can be reduced, thereby improving the use stability and reliability of the packaging structure.

In accordance with a second aspect of the present application, a display device is provided, which includes a plurality of packaging structures as above mentioned, and the packaging structures are arranged in a matrix.

The display device provided by the present application can improve the usability of the display device by improving the packaging structure. In accordance with an exemplary embodiment of the present application, the packaging structure, by improving the structure of the metal bracket and disposing the metal cover plate on the side of the driver chip away from the light-emitting component, enables the driver chip to be located in the space formed by the metal bracket, the pins and the metal cover plate, which can improve the signal shielding capability of the packaging structure, thereby improving the use stability and reliability of the packaging structure.

BRIEF DESCRIPTION OF DRAWINGS

In order to illustrate schemes in embodiments of the present application or in the existing technologies more clearly, the following will briefly introduce the drawings that need to be used for describing the embodiments or the existing technologies. Obviously, the drawings in the following description are merely some embodiments of the present application, and for those of ordinarily skills in the art, other drawings may also be obtained according to these drawings on the premise of paying no creative labor.

REFERENCE SYMBOLS OF MAIN COMPONENTS ARE LISTED AS FOLLOWS

Figure 1:
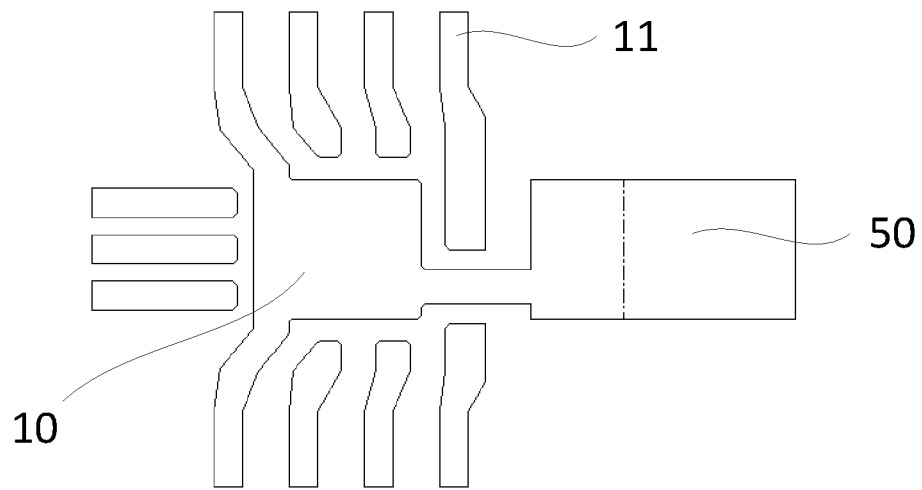
FIG. 1 is a schematic structural diagram of a packaging structure in accordance with an embodiment of the present application.

100—packaging structure;
10—metal bracket; 11—pin; 20—driver chip; 30—light-emitting component; 40—packaging member; 41—first colloid cured layer; 42—second colloid cured layer; 50—metal cover plate; 60—accommodating groove; 70—first groove; 80—second groove; and 90—positioning block.

DETAILED DESCRIPTION OF EMBODIMENTS

In order to illustrate the objectives, schemes and advantages of the present application more clearly, the embodiments of the present application will be further described in detail below with reference to the drawings. It should be understood that the specific embodiments described herein are intended only to explain the present application, but not to limit the present application.

It should be noted that when a component is referred to as being "fixed to" or "disposed on" another component, it may be directly or indirectly on the other component. When an element is referred to as being "connected to" another element, it may be directly or indirectly connected to the other element. The orientation or positional relationship indicated by the terms "upper", "lower", "left", "right", etc. is based on the orientation or positional relationship shown in the drawings, and is only for the convenience of description, rather than indicating or implying the device or elements referred to must have a particular orientation, be constructed or operated in a particular orientation, and therefore should not be construed as a limitation to the present application. The terms "first" and "second" are used only for descriptive purposes, and should not be construed as indicating or implying relative importance or implying the number of the indicated features. The phrase "a/the plurality of" means two or more, unless otherwise expressly and specifically defined.

The present application provides a packaging structure and a display device including a plurality of the packaging structures, and through an improvement of the packaging structure, the usability of related products can be greatly improved.

As shown in FIGS. 1-8, an embodiment of the present application provides a packaging structure 100, which includes a metal bracket 10, a driver chip 20, a light-emitting component 30, a packaging member 40 and a metal cover plate 50.

Figure 5:
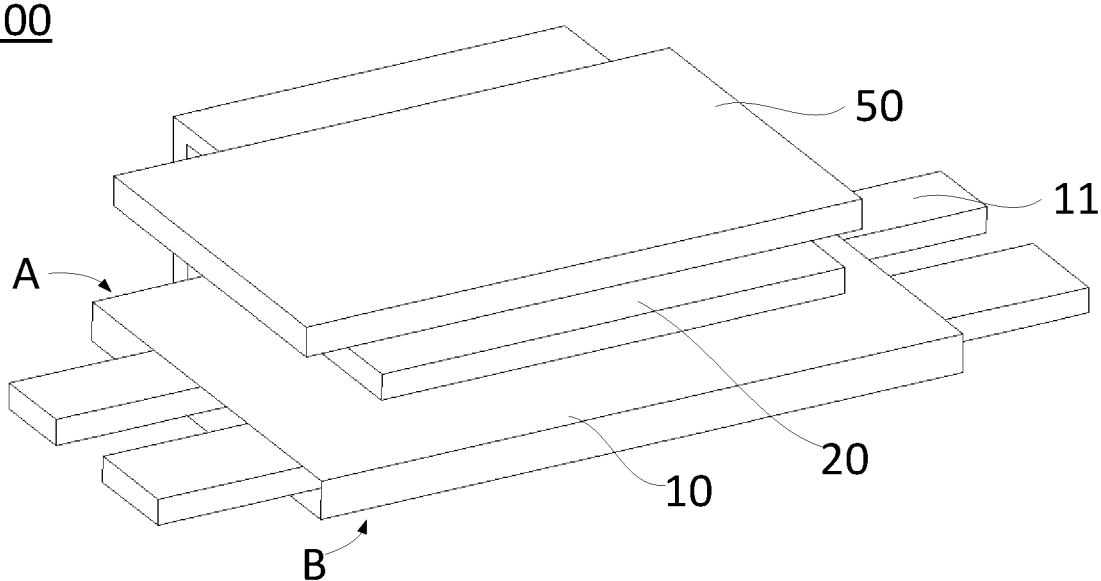
FIG. 5 is a schematic perspective view of the packaging structure shown in FIG. 1.
Figure 7:
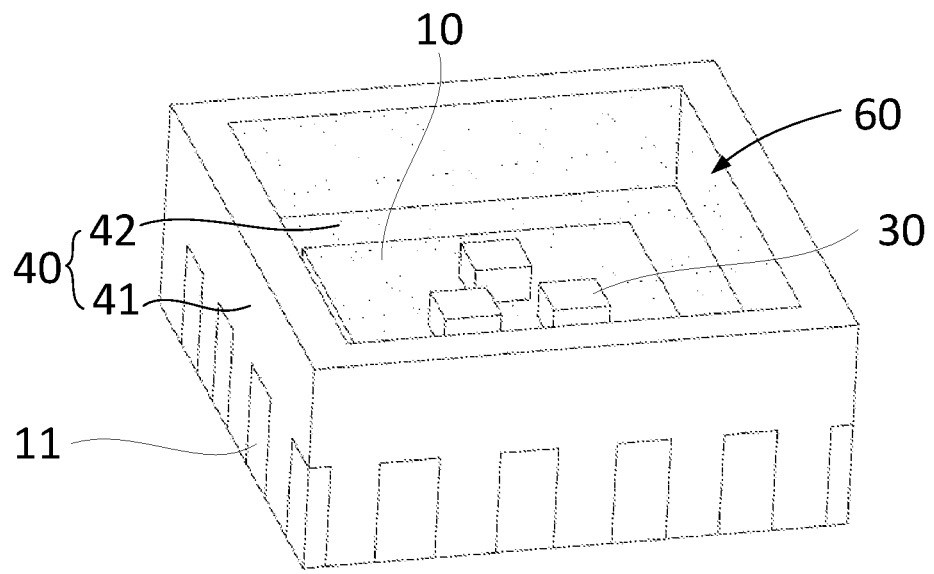
FIG. 7 is a third schematic perspective view of the packaging structure shown in FIG. 1.

As shown in FIG. 1, FIG. 5 and FIG. 7, the metal bracket 10 includes a plurality of pins 11, a first surface (such as the surface A shown in FIG. 5), and a second surface (such as the surface B shown in FIG. 5), the first surface and the second surface are opposite to each other.

As shown in FIG. 5 and FIG. 7, the driver chip 20 is disposed on the first surface of the metal bracket 10, and the driver chip 20 is configured to control a light-emitting state of the light-emitting component 30. In an exemplary embodiment, the driver chip is configured to receive an external electrical signal, and send control information carried by the electrical signal to the light-emitting component 30.

Figure 6:
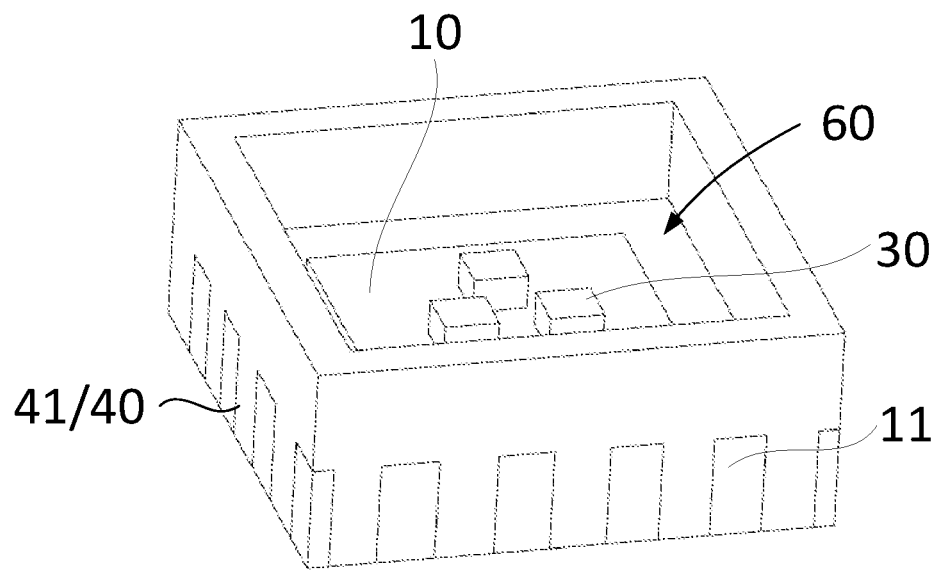
FIG. 6 is a second schematic perspective view of the packaging structure shown in FIG. 1.

As shown in FIG. 5, FIG. 6 and FIG. 7, the light-emitting component 30 is disposed on the second surface of the metal bracket 10 and electrically connected to the driver chip 20 through the metal bracket 10. The driver chip 20 is configured to control the light-emitting state, such as the brightness, color temperature, etc. of the light-emitting component 30.

Figure 3:
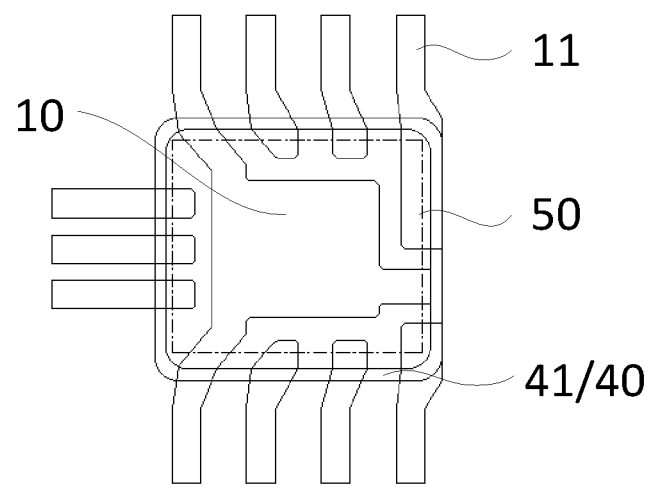
FIG. 3 is a third structural schematic diagram of the packaging structure shown in FIG. 1.
Figure 4:
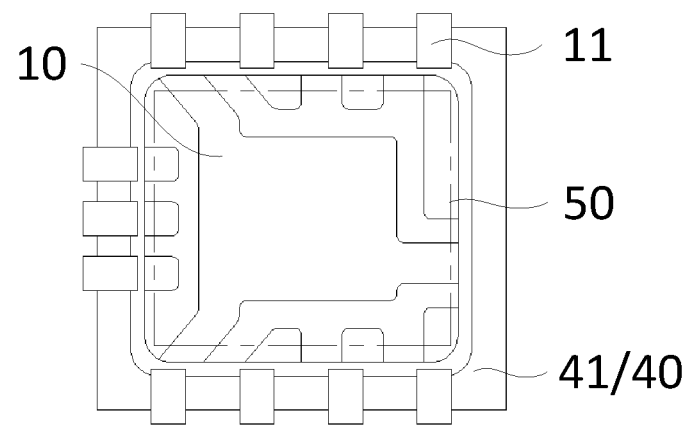
FIG. 4 is a fourth schematic diagram of the packaging structure shown in FIG. 1.

As shown in FIG. 3, FIG. 4 and FIG. 7, the packaging member 40 is disposed on the metal bracket 10. The packaging member 40 is configured to fix the metal bracket and enclose the driver chip 20 and the light-emitting component 30. The pins 11 are disposed surrounding the driver chip 20 and partially exposed to the packaging member 40. The pins 11 are configured to receive an external electrical signal and transmit the electrical signal to the driver chip 20. The control information is carried by the electrical signal.

As shown in FIG. 3, FIG. 5 and FIG. 7, the metal cover plate 50 is disposed on a side of the driver chip 20 away from the light-emitting component 30, covering an entire surface of the driver chip 20. It can be understood that the metal cover plate 50 is a flat cover plate, and the metal cover plate 50 has a size larger than that of the driver chip 20. Referring to the dotted frame in FIG. 2, FIG. 3 and FIG. 4, a region covered by the metal cover plate 50 is shown.

The packaging structure 100 provided by the present application includes a metal bracket 10, a driver chip 20, a light-emitting component 30, a packaging member 40 and a metal cover plate 50. The driver chip 20 and the light-emitting component 30 are respectively disposed on opposite sides of the metal bracket 10, and are electrically connected through the metal bracket 10, to form a vertical packaging structure 100. The packaging member 40 is configured to fix the metal bracket 10 and enclose the driver chip 20 and the light-emitting component 30, the pins 11 are disposed surrounding the driver chip 20, and the metal cover plate 50 is disposed on the side of the driver chip away from the light-emitting component 30, covering the entire surface of the driver chip 20. That is, the metal bracket 10, the pins 11 and the metal cover plate 50 are respectively disposed on different sides of the driver chip 20, so that the six sides of the driver chip 20 are surrounded by metal, i.e., the driver chip 20 is located in a space enclosed by metal, and thus the signal shielding capability of the packaging structure 100 can be improved, the signal interference received by the driver chip 20 can be reduced, the signal interference caused by the driver chip 20 to external components can be reduced, thereby improving the use stability and reliability of the packaging structure 100.

Figure 2:
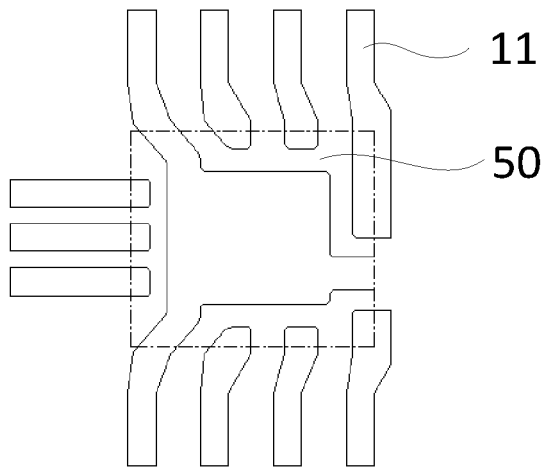
FIG. 2 is a second structural schematic diagram of the packaging structure shown in FIG. 1.

In an embodiment of the present application, as shown in FIG. 1, FIG. 2 and FIG. 5, the metal bracket 10 and the metal cover plate 50 are of an integral structure. The metal cover plate 50 is opposite to the first surface of the metal bracket 10 and an accommodating gap is formed between the metal cover plate 50 and the first surface of the metal bracket 10 for an installation of the driver chip 20. In such a design, the packaging structure 100 has high integrity, the metal cover plate 50 is not easy to fall off, and the manufacturing is convenient. In addition, as shown in FIG. 1, FIG. 5 and FIG. 7, the metal bracket 10 may have a connection portion, and the connection portion is extended to connect with the metal cover plate 50. The metal cover plate 50 can be used to shield the signal interference at the side of the driver chip 20 away from the light-emitting component 30, and the connection portion can be used to shield the signal interference at the peripheral side of the driver chip 20, thereby effectively ensuring the anti-signal interference capability of the packaging structure 100.

Figure 8:
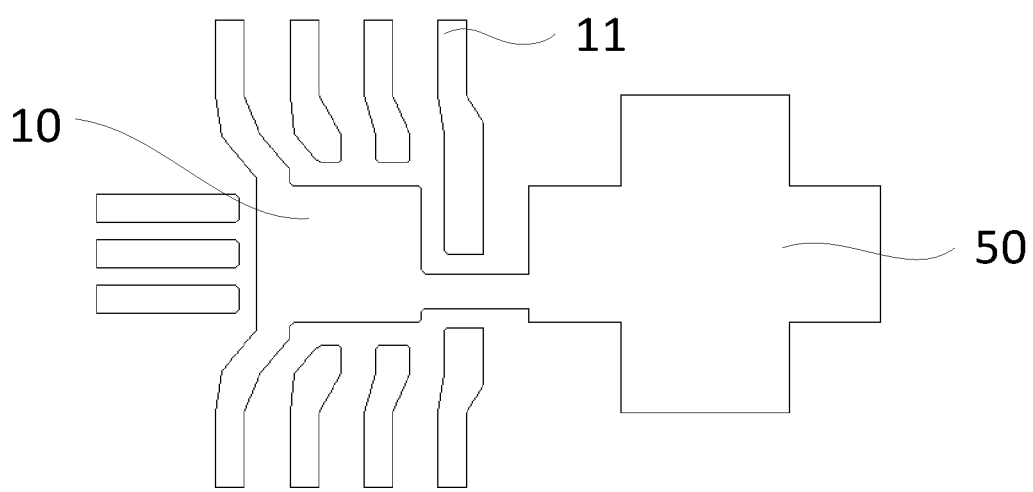
FIG. 8 is a schematic structural diagram of another packaging structure in accordance with an embodiment of the present application.

In an embodiment of the present application, the shape of the metal cover plate 50 is not unique. In some embodiments, as shown in FIG. 1, the shape of the metal cover plate 50 is similar to that of a body (excluding the pins 11) of the metal bracket 10, and the metal cover plate 50 can cover the first surface of the metal bracket 10. Alternatively, in some embodiments, as shown in FIGS. 6 and 8, the size of the metal cover plate 50 is slightly larger than that of the body of the metal bracket 10, and an edge of the metal cover plate 50 can be bent to cover the peripheral side of the packaging member 40.

In an embodiment of the present application, the driver chip 20 and the light-emitting component 30 are welded to the metal bracket 10 and fixed by dispensing glue.

In an embodiment of the present application, as shown in FIG. 4, FIG. 5 and FIG. 6, the packaging member 40 includes a first colloid cured layer 41 that is light-tight. and the first colloid cured layer 41 is configured to fix the metal bracket 10, fill the accommodating gap between the metal cover plate 50 and the first surface of the metal bracket 10, and enclose the driver chip 20. In this way, the first colloid cured layer 41 can encapsulate the driver chip 20, provide physical protection for the driver chip 20, and realize insulation isolation of the driver chip 20, and can support and connect the metal cover plate 50, thereby improving the security and reliability of the packaging structure 100.

Further, as shown in FIG. 6 and FIG. 7, the first colloid cured layer 41 forms an accommodating groove 60 on the second surface of the metal bracket 10, and the light-emitting component 30 is installed in the accommodating groove 60. In this way, the sidewall of the accommodating groove 60 forms a light-blocking structure, and the light beam emitted by the light-emitting component 30 can only be emitted from an unblocked region at the top of the accommodating groove 60, which is beneficial to improve the light-converging property of the light-emitting component 30 and avoid occurrence of bottom or side light leakages. In addition, the light-emitting component is installed in the accommodating groove 60, which can reduce the risk of damage to the light-emitting component 30, and has high reliability.

It can be understood that, as shown in FIG. 6 and FIG. 7, the light-emitting component 30, when being installed in the accommodating groove 60, does not protrude from the accommodating groove 60.

In an embodiment of the present application, as shown in FIG. 7, the packaging member 40 includes a second colloid cured layer 42 capable of transmitting light, and the second colloid cured layer 42 is configured to fill the accommodating groove 60 and enclose the light-emitting component 30. In this way, the second colloid cured layer 42 can encapsulate the light-emitting component 30, provide physical protection for the light-emitting component 30, realize insulation isolation of the light-emitting component 30, and ensure that the light beam emitted by the light-emitting component can be emitted normally, thereby improving the security and reliability of the packaging structure 100.

As shown in FIG. 6, it is a schematic diagram showing that the second colloid cured layer 42 is not filled in the accommodating groove 60, and as shown in FIG. 7, it is a schematic diagram showing that the accommodating groove 60 is filled with the second colloid cured layer 42, and in FIG. 7, the second colloid cured layer capable of transmitting light is in a dot-shaped filling. It can be understood that the second colloid cured layer 42 is filled in the accommodating groove 60, and the second colloid cured layer 42 does not protrude from the accommodating groove 60.

Further, the second colloid cured layer 42 is a light-transmitting colloidal material, such as epoxy resin or silica gel.

In an embodiment of the present application, as shown in FIG. 1, FIG. 4 and FIG. 5, the pins 11 are exposed from the first colloid cured layer 41 and are disposed surrounding outer sides of the first surface and the second surface of the metal bracket 10. The pins 11 is extended to a bottom surface of the first colloid cured layer 41 opposite to the first surface. In such a design, the packaging structure 100 has high integrity, and it is convenient to realize the electrical connection between the pins 11 and the driver chip 20. In addition, the pins 11 are disposed surrounding the sides (i.e., four sides) of the driver chip 20, such that a six-sides surrounded structure is formed through the pins 11, the metal bracket 10 and the metal cover plate 50, which can further improve the anti-signal interference capability of the driver chip 20. In addition, the pins 11 are exposed from the first colloid cured layer 41 and extended to the bottom surface of the first colloid cured layer 41 opposite to the first surface of the metal bracket 10, which has a reasonable structure and is convenient for connection with other components.

Further, each of the pins 11 has a portion being perpendicular to the first surface of the metal bracket 10.

In the packaging structure 100 provided by the present application, the metal bracket 10 and the metal cover plate 50 are made of copper or copper alloy.

Optionally, in an embodiment of the present application, the metal bracket 10 and the metal cover plate 50 are made from a copper sheet. Based on design requirements, the metal bracket 10, the pins 11 and the metal cover plate 50 may be formed by etching on a copper sheet.

In an embodiment of the present application, the light-emitting component 30 includes several light-emitting chips. In an exemplary embodiment, the light-emitting component 30 includes a red light-emitting chip, a green light-emitting chip, and a blue light-emitting chip. These light-emitting chips are independent of each other and the light-emitting situation of these light-emitting chips can be controlled by the driver chip respectively.

The specific manufacturing process of the packaging structure 100 in accordance with an embodiment of the present application includes steps of S1-S5. In the step S1: a copper sheet is provided and a desired pattern is fabricated on the copper sheet to form the metal bracket 10 and the metal cover plate 50, where the metal bracket 10 includes the pins 11 and the oppositely disposed first and second surfaces. In the step S2, the driver chip 20 and the light-emitting component 30 are provided and disposed on the first and second surfaces of the metal bracket 10 respectively. In the step S3, the packaging member 40 is disposed on the metal bracket 10, and configured to fix the metal bracket 10 and enclose the driver chip 20 and the light-emitting component 30. In the step S4, the metal cover plate 50 is folded, enabling the metal cover plate 50 to cover a side of the driver chip 20 away from the light-emitting component 30. In the step S5, the pins 11 are bent, such that the driver chip 20 is surrounded by the pins 11.

To sum up, the packaging structure 100 provided by the present application, by improving the structure of the metal bracket 10 and disposing the metal cover plate 50 on the side of the driver chip 20 away from the light-emitting component 30, enables the driver chip 20 to be located in the space formed by the metal bracket 10, the pins 11 and the metal cover plate 50, such that the signal shielding capability of the packaging structure 100 can be improved, thereby improving the use stability and reliability of the packaging structure 100. In addition, the metal bracket 10 and the metal cover plate 50 of the packaging structure 100 are integrally formed, having high integrity. The metal cover plate 50 is not easy to fall off, and the manufacturing is convenient.

As shown in FIGS. 9-13, a packaging structure 100 is provided in accordance with another embodiment of the present application, which includes a metal bracket 10, a driver chip 20, a light-emitting component 30, a packaging member 40, and a metal cover plate 50.

Figure 9:
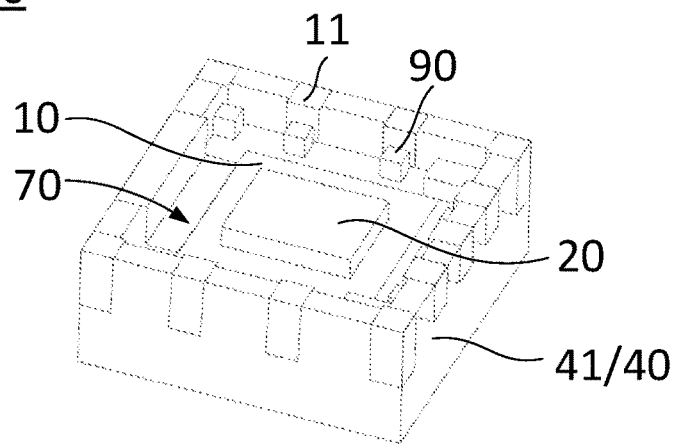
FIG. 9 is a schematic perspective view of a packaging structure in accordance with another embodiment of the present application.
Figure 10:
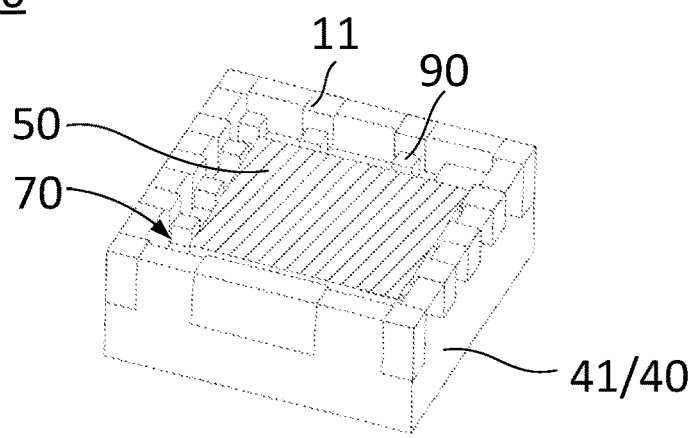
FIG. 10 is a second schematic perspective view of the packaging structure in accordance with another embodiment of the present application.
Figure 13:
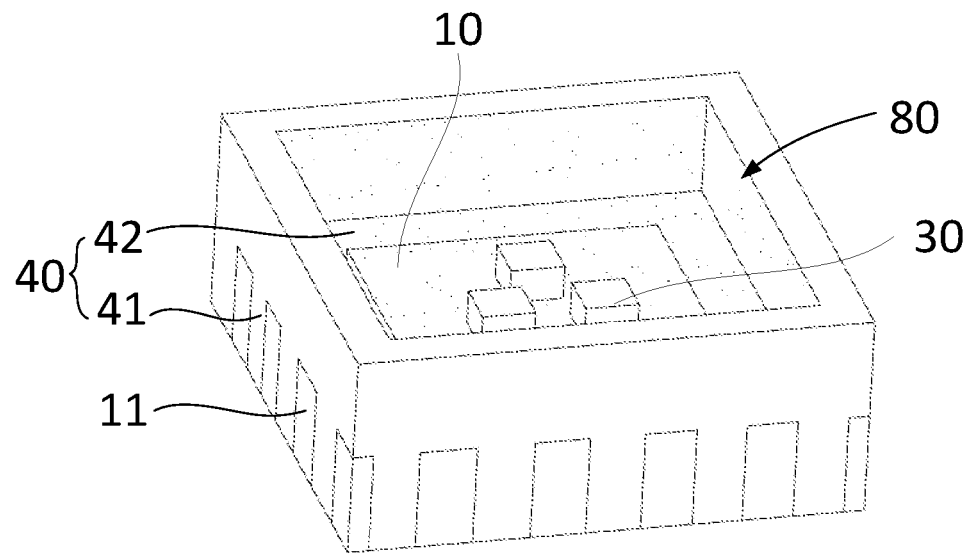
FIG. 13 is a fourth schematic perspective view of the packaging structure in accordance with another embodiment of the present application.

In an embodiment of the present application, as shown in FIGS. 9, 10 and 13, the metal bracket 10 includes a plurality of pins 11, a first surface (such as the surface shown in FIG. 9), and a second surface (such as the surface shown in FIG. 13) opposite to the first surface. The driver chip 20 is disposed on the first surface, the light-emitting component 30 is disposed on the second surface, and the light-emitting component 30 is electrically connected to the driver chip 20 through the metal bracket 10. The driver chip 20 is configured to control a light-emitting state of the light-emitting component 30. The packaging member 40 is disposed on the metal bracket 10, and configured to fix the metal bracket 10 and enclose the driver chip 20 and the light-emitting component 30. The pins 11 are disposed surrounding the driver chip 20 and are partially exposed from the packaging member 40, and the pins 11 are configured to receive an external electrical signal and transmit the electrical signal to the driver chip 20. The metal cover plate 50 is disposed on a side of the driver chip 20 away from the light-emitting component 30, covering an entire surface of the driver chip 20.

Figure 11:
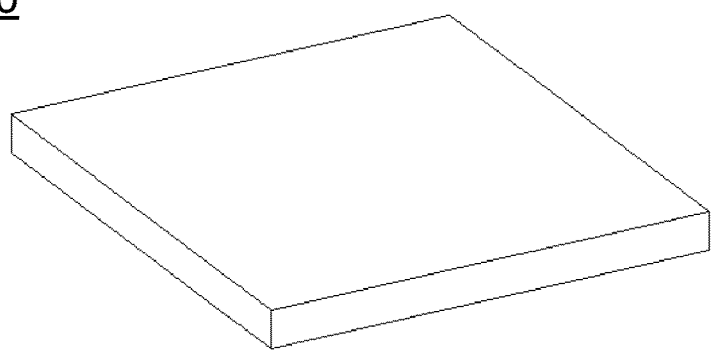
FIG. 11 is a schematic structural diagram of a metal cover plate in the packaging structure shown in FIG. 10.

In an embodiment of the present application, as shown in FIGS. 9, 10 and 11, the metal bracket 10 and the metal cover plate 50 are separate structures, and the metal cover plate 50 is connected to the side of the driver chip 20 away from the light-emitting component 30. In such a design, the driver chip 20 can be easily installed, the space can be effectively integrated, which is beneficial to reduce the size of the packaging structure 100, and has a reasonable structure.

In an embodiment of the present application, as shown in FIG. 9, FIG. 10 and FIG. 13, the packaging member 40 includes a first colloid cured layer 41 that is light-tight, and the first colloid cured layer 41 is configured to fix the metal bracket 10 and form a first groove 70 on the first surface of the metal bracket 10 and a second groove 80 on the second surface of the metal bracket 10. The driver chip 20 is installed in the first groove 70, and the light-emitting component 30 is installed in the second groove 80. As the driver chip 20 and the light-emitting component 30 are respectively installed in the first groove 70 and the second groove 80, the risk of damage to the driver chip 20 and the light-emitting component 30 can be reduced and thus the reliability is high. In addition, the sidewall of the second groove 80 forms a light-blocking structure, and the light beam emitted by the light-emitting component 30 can only be emitted from the unblocked region at the top of the second groove 80, which is beneficial to improve the light-converging property of the light-emitting component 30 and avoid the occurrence of bottom or side light leakages.

Figure 12:
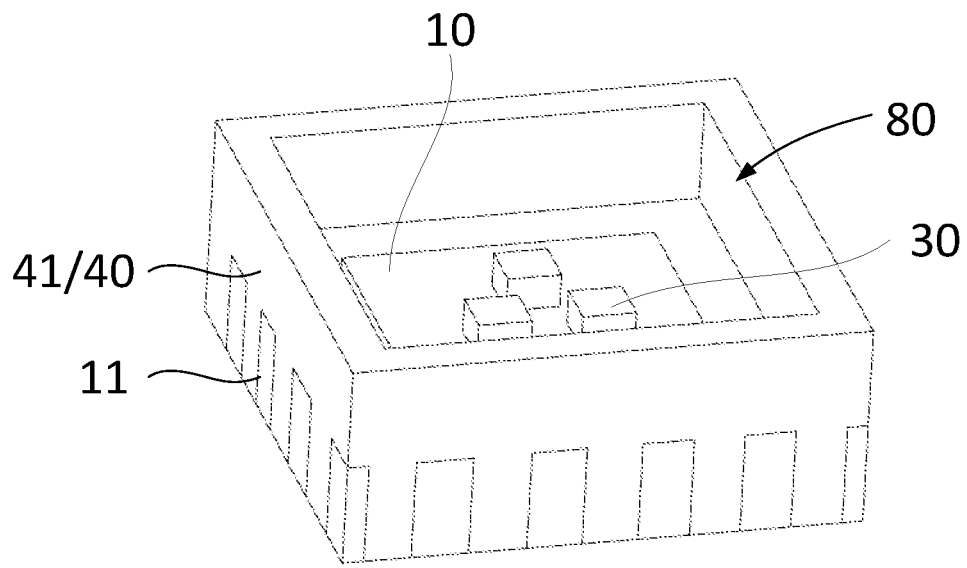
FIG. 12 is a third schematic perspective view of the packaging structure in accordance with another embodiment of the application.

In an embodiment of the present application, as shown in FIGS. 10, 12 and 13, the packaging member 40 includes a second colloid cured layer 42 capable of transmitting light and an insulation adhesive. The second colloid cured layer 42 is filled in the second groove 80, enclosing the light-emitting component 30. The metal cover plate 50 is fixed in the first groove 70 through the insulation adhesive. In such a design, the second colloid cured layer 42 can encapsulate the light-emitting component 30, provide physical protection for the light-emitting component 30, realize insulation isolation of the light-emitting component 30, and ensure that the light beam emitted by the light-emitting component 30 can be emitted normally, thereby improving the security and reliability of the packaging structure 100. In addition, by utilizing the insulation adhesive to fix the metal cover plate 50, insulation isolation between the metal cover plate 50 and the driver chip 20 can be achieved, and physical protection can be provided for the driver chip 20.

It can be understood that, as shown in FIGS. 9 and 10, the metal cover plate 50 is disposed in the first groove 70, and the metal cover plate 50 does not protrude from the first groove 70.

As shown in FIG. 12, it is a schematic diagram showing that the second groove 80 is not filled with the second colloid cured layer 42. As shown in FIG. 13, it is a schematic diagram showing that the second colloid cured layer 42 is filled in the second groove 80, and in FIG. 13 the second colloid cured layer 42 capable of transmitting light is in a dot-shaped filling. It can be understood that, as shown in FIG. 13, the light-emitting component 30 and the second colloid cured layer 42 are disposed in the second groove 80, and the second colloid cured layer 42 does not protrude from the second groove 80.

In an embodiment of the present application, as shown in FIG. 9 and FIG. 13, the pins 11 is extended from a position at the first surface of the metal bracket 10 to a bottom surface of the first colloid cured layer 41 that is opposite to the first surface, and exposed from the bottom surface. The pins 11 are disposed surrounding the first groove 70. In such a design, the pins 11 do not protrude from the peripheral side of the first colloid cured layer 41, no surface space is occupied, thus the structure is reasonable, and is convenient for processing and manufacturing.

In an embodiment of the present application, as shown in FIG. 9 and FIG. 13, the metal bracket 10 is made from etching a copper block, the first groove 70 is formed on the first surface of the metal bracket 10, and the second groove 80 is formed on the second surface of the metal bracket 10. The packaging structure 100 has high support strength, is not easily deformed, and has a stable structure.

To facilitate the fixing of the metal cover plate 50, in an embodiment of the present application, as shown in FIG. 9 and FIG. 10, the metal bracket 10 includes a plurality of positioning blocks 90, which are distributed around the first groove 70, and surrounding the metal cover plate 50.

To sum up, in the packaging structure 100 provided by the present application, by improving the structure of the metal bracket 10 and disposing the metal cover plate 50 on the side of the driver chip 20 away from the light-emitting component 30, the driver chip 20 can be located in the space formed by the metal bracket 10, the pins 11 and the metal cover plate 50, such that the signal shielding capability of the packaging structure 100 can be improved, thereby improving the use stability and reliability of the packaging structure 100. In addition, the metal bracket 10 and the metal cover plate 50 of the packaging structure 100 are separate structures, the components are easy to install, and the space can be effectively integrated, which is beneficial to reduce the size of the packaging structure 100 and has a reasonable structure.

The present application provides a display device, which includes a circuit board and a plurality of packaging structures 100. The packaging structures 100 are disposed on the circuit board and arranged in a matrix.

In the display device provided in the present application, by improving the packaging structure 100, the usability of the display device can be improved and the area of the packaging structure 100 occupied in the display device can be reduced. The packaging structure 100 in accordance with an exemplary embodiment the present application, by improving the structure of the metal bracket 10 and disposing the metal cover plate 50 on the side of the driver chip 20 away from the light-emitting component 30, enables the driver chip 20 to be located in the space formed by the metal bracket 10, the pins 11 and the metal cover plate 50, so that the signal shielding capability of the packaging structure 100 can be improved, thereby improving the use stability and reliability of the packaging structure 100.

The above embodiments are merely intended to illustrate but not to limit the solutions of the present application. Although the present application has been described in detail with reference to the above embodiments, those of ordinary skill in the art should understand that the solutions described in the above implementations may be modified, or some features thereof may be equivalently replaced. These modifications or replacements do not make the essence of the corresponding solutions deviate from the fundamental and scope of the solutions in the embodiments of the present application, and shall be included within the protection scope of the present application.

What is claimed is:

1. A packaging structure, comprising:
   a metal bracket, comprising a plurality of pins, a first surface, and a second surface opposite to the first surface;
   a driver chip, disposed on the first surface of the metal bracket;
   a light-emitting component, disposed on the second surface of the metal bracket and electrically connected to the driver chip through the metal bracket, wherein the driver chip is configured to control a light-emitting state of the light-emitting component;
   a packaging member, disposed on the metal bracket and configured to fix the metal bracket and enclose the driver chip and the light-emitting component, wherein the pins are disposed surrounding the driver chip and partially exposed from the packaging member, and the pins are configured to receive an external electrical signal and transmit the external electrical signal to the driver chip; and
   a metal cover plate, disposed on a side of the driver chip away from the light-emitting component and covering an entire surface of the driver chip,
   wherein the metal bracket and the metal cover plate are of an integral structure, the metal cover plate is opposite to the first surface of the metal bracket, an accommodating gap is formed between the metal cover plate and the first surface of the metal bracket, and the driver chip is installed in the accommodating gap.

2. The packaging structure according to claim 1, wherein the packaging member comprises a first colloid cured layer that is light-tight, and the first colloid cured layer is configured to fix the metal bracket, fill the accommodating gap, and enclose the driver chip, wherein the first colloid cured layer forms an accommodating groove on the second surface of the metal bracket, and the light-emitting component is installed in the accommodating groove.

3. The packaging structure according to claim 2, wherein the packaging member comprises a second colloid cured layer capable of transmitting light, and the second colloid cured layer is configured to fill the accommodating groove and enclose the light-emitting component.

4. The packaging structure according to claim 2, wherein the pins are exposed from the first colloid cured layer and disposed surrounding outer sides of the first surface and the second surface, and the pins are extended to a bottom surface of the first colloid cured layer opposite to the first surface.

5. A packaging structure, comprising:
   a metal bracket, comprising a plurality of pins, a first surface, and a second surface opposite to the first surface;

a driver chip, disposed on the first surface of the metal bracket;

a light-emitting component, disposed on the second surface of the metal bracket and electrically connected to the driver chip through the metal bracket, wherein the driver chip is configured to control a light-emitting state of the light-emitting component;

a packaging member, disposed on the metal bracket and configured to fix the metal bracket and enclose the driver chip and the light-emitting component, wherein the pins are disposed surrounding the driver chip and partially exposed from the packaging member, and the pins are configured to receive an external electrical signal and transmit the external electrical signal to the driver chip; and a metal cover plate, disposed on a side of the driver chip away from the light-emitting component and covering an entire surface of the driver chip, wherein the packaging member comprises a first colloid cured layer that is light-tight, the first colloid cured layer is configured to fix the metal bracket and form a first groove on the first surface of the metal bracket and a second groove on the second surface of the metal bracket, wherein the driver chip is installed in the first groove, and the light-emitting component is installed in the second groove, wherein the packaging member comprises an insulation adhesive, and the metal cover plate is fixed in the first groove through the insulation adhesive, and wherein the metal bracket comprises a plurality of positioning blocks, and the positioning blocks are distributed around the first groove, surrounding the metal cover plate.

6. The packaging structure according to claim 5, wherein the packaging member comprises a second colloid cured layer capable of transmitting light, the second colloid cured layer is filled in the second groove, enclosing the light-emitting component.

7. The packaging structure according to claim 6, wherein the pins are extended from a position at the first surface to a bottom surface of the first colloid cured layer opposite to the first surface and exposed from the bottom surface, wherein the pins are disposed surrounding the first groove.

8. A display device, comprising:

a plurality of packaging structures, arranged in a matrix, and each of the packaging structures comprising:

a metal bracket, comprising a plurality of pins, a first surface, and a second surface opposite to the first surface;

a driver chip, disposed on the first surface of the metal bracket;

a light-emitting component, disposed on the second surface of the metal bracket and electrically connected to the driver chip through the metal bracket, wherein the driver chip is configured to control a light-emitting state of the light-emitting component;

a packaging member, disposed on the metal bracket and configured to fix the metal bracket and enclose the driver chip and the light-emitting component, wherein the pins are disposed surrounding the driver chip and partially exposed from the packaging member, and the pins are configured to receive an external electrical signal and transmit the external electrical signal to the driver chip; and a metal cover plate, disposed on a side of the driver chip away from the light-emitting component, and covering an entire surface of the driver chip, wherein the metal bracket and the metal cover plate are of an integral structure, the metal cover plate is opposite to the first surface of the metal bracket, an accommodating gap is formed between the metal cover plate and the first surface of the metal bracket, and the driver chip is installed in the accommodating gap.

9. The display device according to claim 8, wherein the packaging member comprises a first colloid cured layer that is light-tight, and the first colloid cured layer is configured to fix the metal bracket, fill the accommodating gap, and enclose the driver chip, wherein the first colloid cured layer forms an accommodating groove on the second surface of the metal bracket, and the light-emitting component is installed in the accommodating groove.

10. The display device according to claim 9, wherein the packaging member comprises a second colloid cured layer capable of transmitting light, and the second colloid cured layer is configured to fill the accommodating groove and enclose the light-emitting component.

11. The display device according to claim 9, wherein the pins are exposed from the first colloid cured layer and disposed surrounding outer sides of the first surface and the second surface, and the pins are extended to a bottom surface of the first colloid cured layer opposite to the first surface.

12. The display device according to claim 8, wherein the packaging member comprises a first colloid cured layer that is light-tight, the first colloid cured layer is configured to fix the metal bracket, and form a first groove on the first surface of the metal bracket and a second groove on the second surface of the metal bracket, wherein the driver chip is installed in the first groove, and the light-emitting component is installed in the second groove.

13. The display device according to claim 12, wherein the packaging member comprises a second colloid cured layer capable of transmitting light and an insulation adhesive, the second colloid cured layer is filled in the second groove, enclosing the light-emitting component, and the metal cover plate is fixed in the first groove through the insulation adhesive.

14. The display device according to claim 13, wherein the pins are extended from a position at the first surface to a bottom surface of the first colloid cured layer opposite to the first surface, and exposed from the bottom surface, wherein the pins are disposed surrounding the first groove.

15. The display device according to any claim 14, wherein the metal bracket comprises a plurality of positioning blocks, and the positioning blocks are distributed around the first groove, surrounding the metal cover plate.

* * * * *